US010325900B2

(12) United States Patent
Lin et al.

(10) Patent No.: US 10,325,900 B2
(45) Date of Patent: Jun. 18, 2019

(54) INTEGRATED CIRCUIT AND METHOD OF FABRICATING THE SAME

(71) Applicant: Taiwan Semiconductor Manufacturing Company, Ltd., Hsinchu (TW)

(72) Inventors: Chung-Te Lin, Tainan (TW); Ting-Wei Chiang, New Taipei (TW); Hui-Zhong Zhuang, Kaohsiung (TW); Pin-Dai Sue, Tainan (TW); Li-Chun Tien, Tainan (TW)

(73) Assignee: Taiwan Semiconductor Manufacturing Co., Ltd, Hsinchu (TW)

( * ) Notice: Subject to any disclaimer, the term of this patent is extended or adjusted under 35 U.S.C. 154(b) by 0 days.

(21) Appl. No.: 16/051,241

(22) Filed: Jul. 31, 2018

(65) Prior Publication Data
US 2018/0337167 A1  Nov. 22, 2018

Related U.S. Application Data

(62) Division of application No. 15/145,354, filed on May 3, 2016, now Pat. No. 10,163,880.

(51) Int. Cl.
*H01L 27/02* (2006.01)
*G06F 17/50* (2006.01)
*H01L 27/092* (2006.01)
*H01L 29/423* (2006.01)
*H01L 27/118* (2006.01)

(52) U.S. Cl.
CPC ...... *H01L 27/0207* (2013.01); *G06F 17/5072* (2013.01); *H01L 27/092* (2013.01); *H01L 29/42376* (2013.01); *H01L 2027/11875* (2013.01)

(58) Field of Classification Search
CPC ............... H01L 27/0207; H01L 27/092; H01L 29/42376; H01L 2027/11875; G06F 17/5072
See application file for complete search history.

(56) References Cited

U.S. PATENT DOCUMENTS

| | | | |
|---|---|---|---|
| 8,324,668 B2 | 12/2012 | Huang et al. |
| 8,847,284 B2 | 9/2014 | Yang et al. |
| 9,041,115 B2 | 5/2015 | Liaw |
| 2007/0200182 A1 | 8/2007 | Liaw |
| 2011/0157965 A1 | 6/2011 | Nii |
| 2013/0334610 A1 | 12/2013 | Moroz et al. |
| 2014/0077303 A1 | 3/2014 | Baek |
| 2014/0131813 A1 | 5/2014 | Liaw |

(Continued)

FOREIGN PATENT DOCUMENTS

| | | | |
|---|---|---|---|
| DE | 102012108290 A1 | 11/2013 |
| JP | 5018475 B2 | 9/2012 |

(Continued)

*Primary Examiner* — Latanya N Crawford
(74) *Attorney, Agent, or Firm* — Slater Matsil, LLP

(57) ABSTRACT

A layout includes a plurality of cells and at least one dummy gate electrode continuously extends across the cells. Since the dummy gate electrode is electrically conductive, the dummy gate electrode can be utilized for interconnecting the cells. That is, some signals may travel through the dummy gate electrode rather than through a metal one line or a metal two line. Therefore, an amount of metal one lines and/or metal two lines for interconnecting the cells can be reduced.

20 Claims, 7 Drawing Sheets

(56) References Cited

U.S. PATENT DOCUMENTS

| | | |
|---|---|---|
| 2014/0183647 A1 | 7/2014 | Lu et al. |
| 2014/0239412 A1 | 8/2014 | Yang et al. |
| 2014/0282325 A1 | 9/2014 | Chen et al. |
| 2015/0035070 A1 | 2/2015 | Chiang et al. |
| 2016/0190138 A1 | 6/2016 | Shimbo |

FOREIGN PATENT DOCUMENTS

| | | |
|---|---|---|
| KR | 20140036446 A | 3/2014 |
| KR | 20140062404 A1 | 5/2014 |
| KR | 20140107090 A | 9/2014 |
| KR | 20150031249 A1 | 3/2015 |
| TW | 201123419 A | 7/2011 |
| TW | 201434111 A | 9/2014 |
| WO | 2015033490 A1 | 3/2015 |

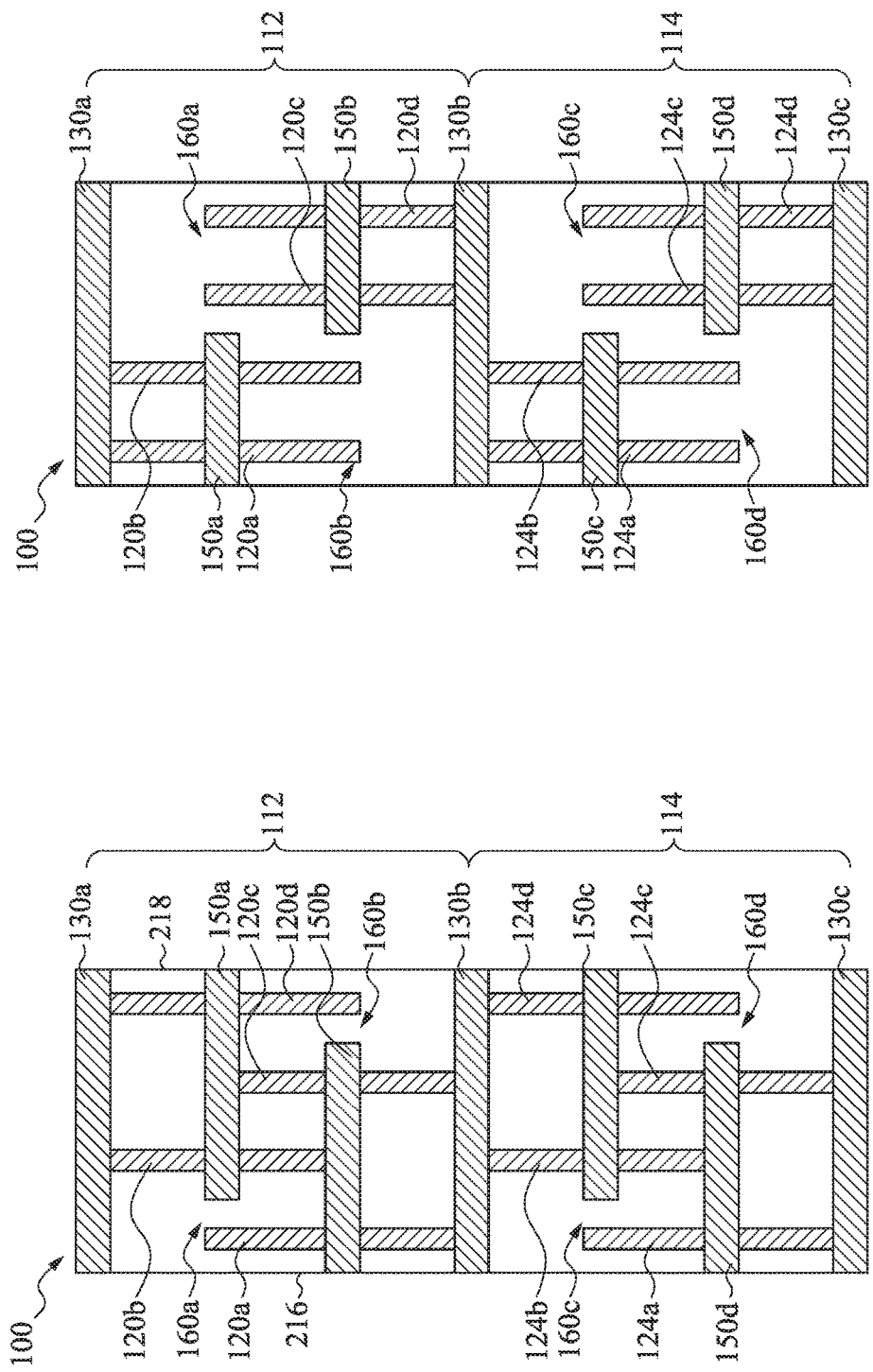

INTEGRATED CIRCUIT AND METHOD OF FABRICATING THE SAME

PRIORITY CLAIM AND CROSS-REFERENCE

This application is a divisional of U.S. patent application Ser. No. 15/145,354, filed on May 3, 2016, and entitled "Integrated Circuit and Method of Fabricating the Same," which application is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation.

The trend in very-large-scale integration (VLSI) technology has resulted in narrower interconnection lines and smaller contacts. Furthermore, integrated circuit designs are becoming more complex and denser. More devices are compressed in integrated circuits to improve performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 5C are top views of cell layouts in accordance with different embodiments of the disclosure.

DETAILED DESCRIPTION

Figure 1:
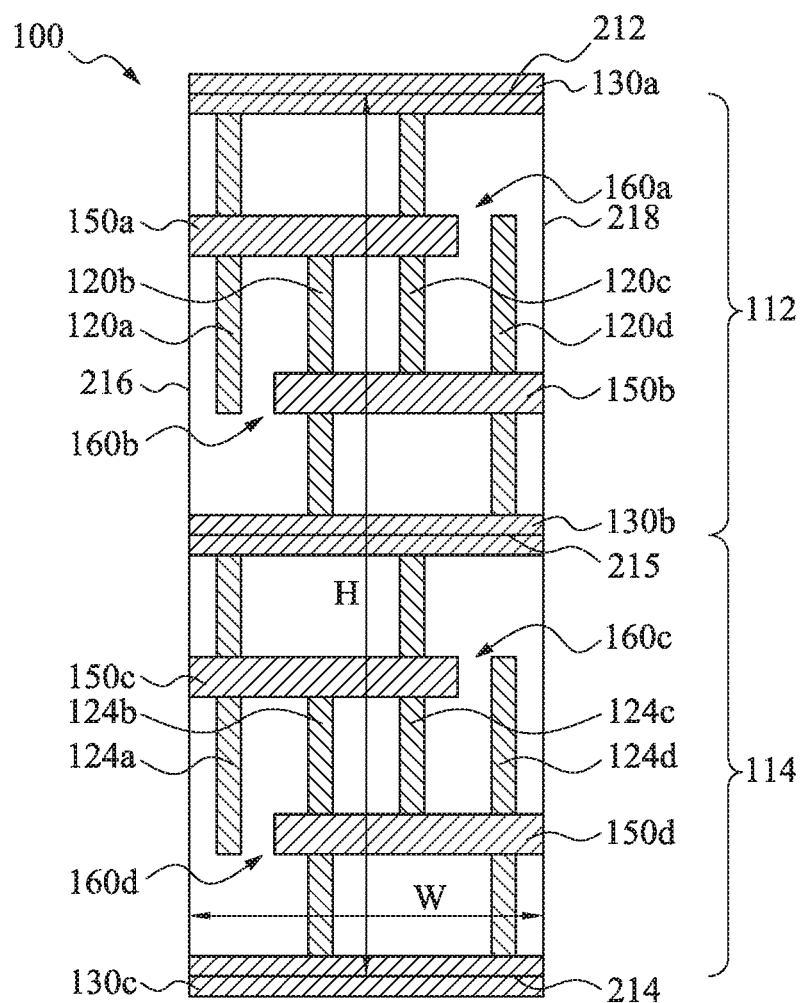
FIG. 1 is a top view of a cell layout in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1, in which FIG. 1 is a top view of a cell layout in accordance with some embodiments of the present disclosure. The cell 100 is present on a semiconductor substrate. The cell 100 has a cell boundary including a top edge 212, a bottom edge 214, and opposite side edges 216 and 218. A cell height H is defined between the top edge 212 and the bottom edge 214. A cell width W is defined between the opposite side edges 216 and 218.

The cell 100 includes a first transistor region 112 and a second transistor region 114, in which the first transistor region 112 is arranged vertically next to the second transistor region 114. A common boundary line 215 separates the first transistor region 112 and the second transistor region 114. The first transistor region 112 of the cell 100 can be arranged to form PMOS (P-channel Metal Oxide Semiconductor) transistors and can be regarded as a PMOS region 112. The second transistor region 114 of the cell 100 can be arranged to form NMOS (N-channel Metal Oxide Semiconductor) transistors and can be regarded as an NMOS region 114.

A plurality of P-type active regions 120a-120d are present in the PMOS region 112, and a plurality of N-type active regions 124a-124d are present in the NMOS region 114. In some embodiments, an active region, such as the P-type active regions 120a-120d and the N-type active regions 124a-124d, is also referred to herein as OD (oxide-dimensioned region). In FIG. 1, the P-type active regions 120a-120d are substantially perpendicular to the top edge 212 and are substantially equally spaced apart. The N-type active regions 124a-124d are substantially perpendicular to the bottom edge 214 and are substantially equally spaced apart. In some embodiments, the P-type active regions 120a-120d and the N-type active regions 124a-124d are fin shaped, and the P-type active regions 120a-120d and the N-type active regions 124a-124d are substantially parallel to each other and are staggered in the PMOS region 112 and the NMOS region 114.

Gate electrodes 150a-150d and dummy gate electrodes 130a-130c are present over the semiconductor substrate. In FIG. 1, the gate electrodes 150a-150d and the dummy gate electrodes 130a-130c are substantially parallel to each other and are substantially parallel to the top edge 212, the common boundary line 215, and the bottom edge 214. The gate electrodes 150a-150d and the dummy gate electrodes 130a-130c are formed of polysilicon or other electrically conductive materials such as metals, metal alloys, and metal silicides. The dummy gate electrodes 130a-130c are arranged to not act as a gate to any transistor. In some embodiments, gate electrodes and dummy gate electrodes, such as the gate electrodes 150a-150d and the dummy gate electrodes 130a-130c, are also referred to herein as PO. In some embodiments, the dummy gate electrodes 130a-130c are also referred to herein as PODE (poly on OD edge).

The gate electrodes 150a and 150b are present in the PMOS region 112. The gate electrode 150a crosses the P-type active regions 120a and 120c and is partially present on an edge of the P-type active region 120b, in which the gate electrode 150a is regarded as a dummy gate electrode to the P-type active region 120b. The gate electrode 150b crosses the P-type active regions 120b and 120d and is partially present on an edge of the P-type active region 120c, in which the gate electrode 150b is regarded as a dummy gate electrode to the P-type active region 120c. The gate electrodes 150c and 150d are present in the NMOS region 114. The gate electrode 150c crosses the N-type active regions 124a and 124c and is partially present on an edge of the N-type active region 124b, in which the gate electrode 150c is regarded as a dummy gate electrode to the N-type active region 124b. The gate electrode 150d crosses the N-type active regions 124b and 124d and is partially present on an edge of the N-type active region 124c, in which the gate electrode 150d is regarded as a dummy gate electrode to the N-type active region 124c.

The cell 100 further includes a plurality of cutting patterns 160a-160d, such as cut polysilicon (CPO) patterns, for respectively terminating the gate electrodes 150a-150d. The cutting patterns 160a-160d respectively represent cut sections or patterning areas where the gate electrodes 150a-150d are removed. In some embodiments, the length of at least one of the gate electrodes 150a-150d is less than the length of at least one of the dummy gate electrodes 130a-130c because of existence of the cutting patterns 160a-160d.

In some embodiments, the gate electrodes 150a-150d are staggered in the cell 100. As shown in FIG. 1, the gate electrodes 150a and 150c extend from the side edge 216 while being spaced from the side edge 218 respectively by the cutting patterns 160a and 160c, and the gate electrodes 150b and 150d extend from the side edge 218 while being spaced from the side edge 216 respectively by the cutting patterns 160b and 160d.

In some embodiments, the dummy gate electrode 130a is present on the top edge 212, the dummy gate electrode 130b is present on the common boundary line 215, and the dummy gate electrode 130c is present on the bottom edge 214. The gate electrodes 150a and 150b are present between the dummy gate electrodes 130a and 130b, in which the gate electrode 150a is present between the dummy gate electrode 130a and the gate electrode 150b, and the gate electrode 150b is present between the gate electrode 150a and the dummy gate electrode 130b. The gate electrodes 150c and 150d are present between the dummy gate electrodes 130b and 130c, in which the gate electrode 150c is present between the dummy gate electrode 130b and the gate electrode 150d, and the gate electrode 150d is present between the gate electrode 150c and the dummy gate electrode 130c.

In some embodiments, the P-type active regions 120a-120d are staggered in the PMOS region 112, and the N-type active regions 124a-124d are staggered in the NMOS region 114. As shown in FIG. 1, the P-type active regions 120a and 120c are partially present under the dummy gate electrode 130a while being spaced from the dummy gate electrode 130b. The P-type active regions 120b and 120d are partially present under the dummy gate electrode 130b while being spaced from the dummy gate electrode 130a. The N-type active regions 124a and 124c are partially present under the dummy gate electrode 130b while being spaced from the dummy gate electrode 130c. The N-type active regions 124b and 124d are partially present under the dummy gate electrode 130c while being spaced from the dummy gate electrode 130b.

Figure 2:
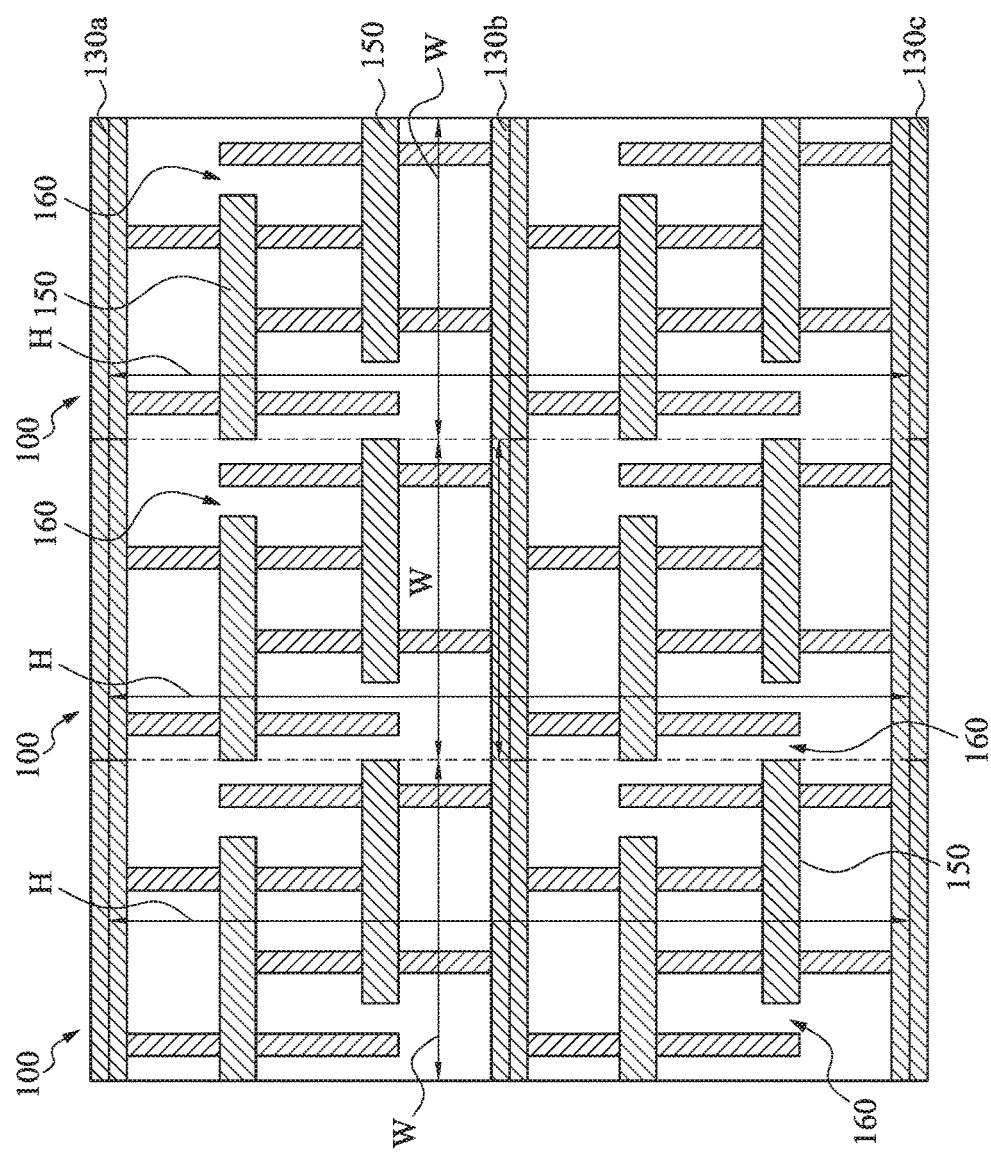
FIG. 2 is a top view of a layout in accordance with some embodiments of the disclosure.

Reference is made to FIG. 2, in which FIG. 2 is a top view of a layout in accordance with some embodiments of the present disclosure. The layout includes a plurality of the cells 100 abutted in at least one row. The cell heights H of the cells 100 are substantially the same, which enables the cells 100 to be placed in the row. The dummy gate electrodes 130a-130c extend substantially along a longitudinal direction of the row. Therefore, the lengths of the dummy gate electrodes 130a-130c are not constrained by the cell heights H of the cells 100.

In some embodiments, the dummy gate electrodes 130a-130c are continuous at least between corresponding active regions of adjacent cells 100. As shown in FIG. 2, the dummy gate electrodes 130a-130c of adjacent cells 100 at the same horizontal level are monolithically connected to each other. For example, the dummy gate electrodes 130a of adjacent cells 100 are monolithically connected to each other, the dummy gate electrodes 130b of adjacent cells 100 are monolithically connected to each other, and the dummy gate electrodes 130c of adjacent cells 100 are monolithically connected to each other. As a result, the dummy gate electrodes 130a-130c can be regarded as continuous conductive lines across the cells 100, and the lengths of the dummy gate electrodes 130a-130c can be as long as a sum of the cell widths W of the cells 100, respectively.

As shown in FIG. 2, the dummy gate electrodes 130a-130c are continuous across at least one common boundary of adjacent cells 100. Since the cutting patterns 160 respectively terminate the gate electrodes 150, the length of at least one of the dummy gate electrodes 130a-130c is greater than the length of at least one of the gate electrodes 150, in which the length of each gate electrode 150 is a distance between the corresponding cutting patterns 160.

In some embodiments, the dummy gate electrodes 130a-130c extend at least across two adjacent cells 100 abutted in the row. As shown in FIG. 2, the cutting patterns 160 are respectively present between end-to-end adjacent gate electrodes 150, and therefore the length of at least one of the dummy gate electrodes 130a-130c is greater than at least a sum of lengths of two end-to-end adjacent gate electrodes 150.

Since the dummy gate electrodes 130a-130c are continuous and electrically conductive, the dummy gate electrodes 130a-130c can be utilized for interconnecting the cells 100. That is, some signals may travel through the dummy gate electrodes 130a-130c rather than through a metal one line or a metal two line. Therefore, an amount of metal one lines and/or metal two lines for interconnecting the cells 100 can be reduced. Furthermore, a pitch between adjacent cells 100 can be reduced as well since the amount of the metal one lines and/or the metal two lines for interconnecting the cells 100 is reduced.

Figure 3:
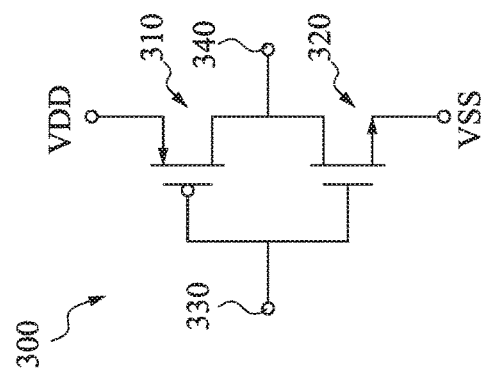
FIG. 3 is a schematic diagram of an inverter in accordance with some embodiments of the disclosure.

Reference is made to FIG. 3, which is a schematic diagram of an inverter in accordance with some embodiments of the present disclosure. The inverter 300 includes a PMOS transistor 310 and an NMOS transistor 320. An input port 330 of the inverter 300 is electrically connected to gate terminals of the PMOS transistor 310 and the NMOS transistor 320. An output port 340 of the inverter 300 is electrically connected to drain terminals of the PMOS transistor 310 and the NMOS transistor 320.

When the input port 330 is set to "0" (for example, ground voltage), the PMOS transistor 310 is turned on, and the NMOS transistor 320 is turned off. In such a situation, current flows from VDD (voltage drain drain) through the PMOS transistor 310 to the output port 340. When the input port 330 is set to "1" (for example, operation voltage), the PMOS transistor 310 is turned off, and the NMOS transistor 320 is turned on. In such a situation, current flows from the output port 340 through the NMOS transistor 320 to VSS (voltage source source).

Figure 4:
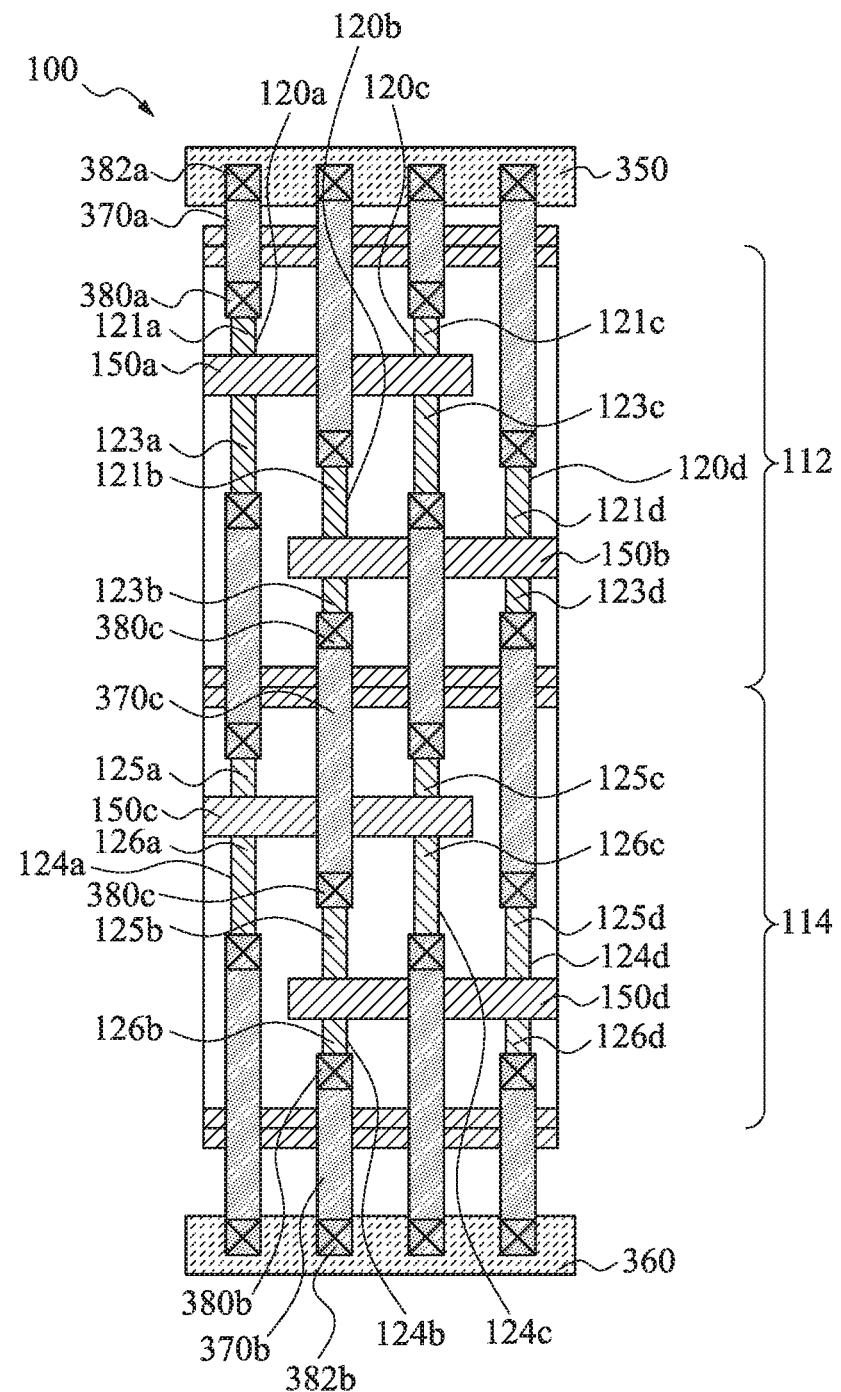
FIG. 4 is a top view of a layout in accordance with some embodiments of the present disclosure.

FIG. 4 is a top view of a layout in accordance with some embodiments of the present disclosure. The PMOS region 112 of the cell 100 includes four PMOS transistors, such as the PMOS transistor 310 in FIG. 3. Source regions 121a-121d and drain regions 123a-123d are respectively present in the P-type active regions 120a-120d. Each of adjacent source regions 121a-121d and drain regions 123a-123d are on opposite sides of a corresponding gate electrode. In such a situation, each of the adjacent source regions 121a-121d, the drain regions 123a-123d, and a corresponding gate electrode form a PMOS transistor. For example, the source region 121a, the drain region 123a, and the gate electrode 150a form a first PMOS transistor. For another example, the source region 121b, the drain region 123b, and the gate electrode 150b form a second PMOS transistor. For yet another example, the source region 121c, the drain region 123c, and the gate electrode 150a form a third PMOS transistor. For still another example, the source region 121d, the drain region 123d, and the gate electrode 150b form a fourth PMOS transistor.

The NMOS region 114 of the cell 100 includes four NMOS transistors, such as the NMOS transistor 320 in FIG. 3. Drain regions 125a-125d and source regions 126a-126d are respectively present in the N-type active regions 124a-124d. Each of adjacent drain regions 125a-125d and source regions 126a-126d are on opposite sides of a corresponding gate electrode. In such a situation, each of the adjacent drain regions 125a-125d, the source regions 126a-126d, and a corresponding gate electrode form an NMOS transistor. For example, the drain region 125a, the source region 126a, and the gate electrode 150c form a first NMOS transistor. For another example, the drain region 125b, the source region 126b, and the gate electrode 150d form a second NMOS transistor. For yet another example, the drain region 125c, the source region 126c, and the gate electrode 150c form a third NMOS transistor. For still another example, the drain region 125d, the source region 126d, and the gate electrode 150d form a fourth NMOS transistor.

A VDD power supply line 350 and a VSS ground line 360 are implemented, for example, in metal two lines. In a top-down sequence, the VDD power supply line 350 is connected through conductive via ones 382a, conductive metal one lines 370a, and conductive via zeros 380a to each of the source regions 121a-121d of the corresponding PMOS transistors. Similarly, the VSS ground line 360 is connected through conductive via ones 382b, conductive metal one lines 370b, and conductive via zeros 380b to each of the source regions 126a-126d of the corresponding NMOS transistors. The drain regions 123a-123d of the PMOS transistors are respectively connected to the drain regions 125a-125d of the NMOS transistors through conductive via zeros 380c and conductive metal one lines 370c.

In some embodiments where the cell 100 is arranged to form two inverters, output ports of the two inverters are respectively on at least two output metal lines (not shown). One of the output metal lines is electrically connected to each of the drain regions 123a and 123c of the PMOS transistors and the drain regions 125a and 125c of the NMOS transistors, and another of the output metal lines is electrically connected to each of the drain regions 123b and 123d of the PMOS transistors and the drain regions 125b and 125d of the NMOS transistors. On the other hand, input ports of the two inverters are respectively on two input metal lines (not shown). One of the input metal lines is electrically connected to each of the gate electrodes 150a and 150c, and another of the input metal lines is electrically connected to each of the gate electrodes 150b and 150d. As a result, the two inverters can be formed within the cell 100.

Figure 5C:
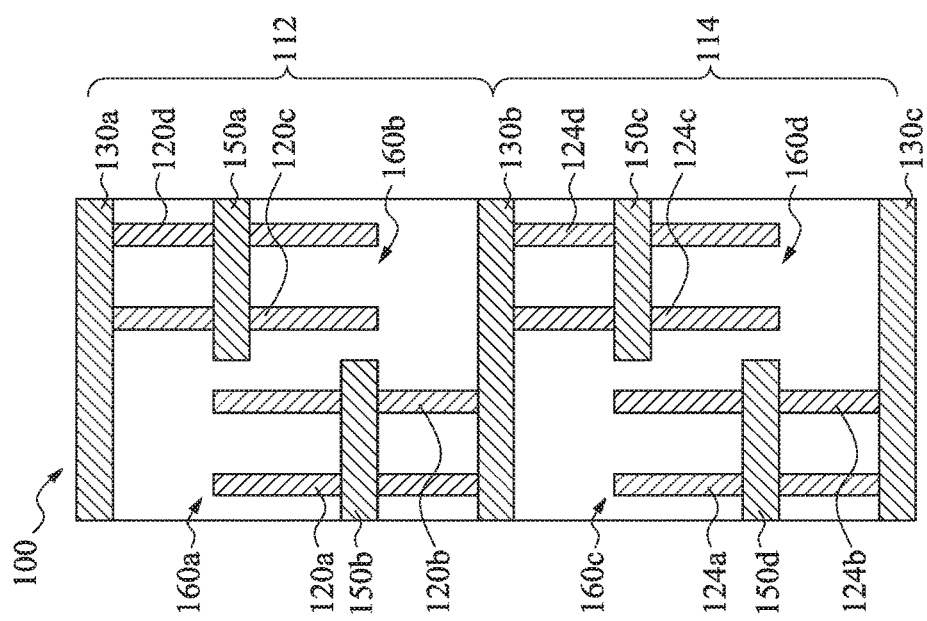

Reference is made to FIG. 5A to FIG. 5C, which are top views of cell layouts in accordance with some embodiments of the present disclosure. The difference among FIGS. 5A-5C and FIG. 1 includes the arrangement of the P-type active regions 120a-120d, the N-type active regions 124a-124d, and the gate electrodes 150a-150d. Referring to FIG. 5A, the P-type active regions 120b and 120d are partially present under the dummy gate electrode 130a while being spaced from the dummy gate electrode 130b. The P-type active regions 120a and 120c are partially present under the dummy gate electrode 130b while being spaced from the dummy gate electrode 130a. The N-type active regions 124b and 124d are partially present under the dummy gate electrode 130b while being spaced from the dummy gate electrode 130c. The N-type active regions 124a and 124c are partially present under the dummy gate electrode 130c while being spaced from the dummy gate electrode 130b. The gate electrodes 150a and 150c extend from the side edge 218 while being spaced from the side edge 216 respectively by the cutting patterns 160a and 160c, and the gate electrodes 150b and 150d extend from the side edge 216 while being spaced from the side edge 218 respectively by the cutting patterns 160b and 160d.

Referring to FIG. 5B, the P-type active regions 120a and 120b are partially present under the dummy gate electrode 130a while being spaced from the dummy gate electrode 130b. The P-type active regions 120c and 120d are partially present under the dummy gate electrode 130b while being spaced from the dummy gate electrode 130a. The N-type active regions 124a and 124b are partially present under the dummy gate electrode 130b while being spaced from the dummy gate electrode 130c. The N-type active regions 124c and 124d are partially present under the dummy gate electrode 130c while being spaced from the dummy gate electrode 130b. The gate electrode 150a crosses the P-type active regions 120a and 120b while not crossing the P-type active regions 120c and 120d. The gate electrode 150b crosses the P-type active regions 120c and 120d while not crossing the P-type active regions 120a and 120b. The gate electrode 150c crosses the N-type active regions 124a and 124b while not crossing the N-type active regions 124c and 124d. The gate electrode 150d crosses the N-type active regions 124c and 124d while not crossing the N-type active regions 124a and 124b.

Referring to FIG. 5C, the P-type active regions 120c and 120d are partially present under the dummy gate electrode 130a while being spaced from the dummy gate electrode 130b. The P-type active regions 120a and 120b are partially present under the dummy gate electrode 130b while being spaced from the dummy gate electrode 130a. The N-type active regions 124c and 124d are partially present under the dummy gate electrode 130b while being spaced from the dummy gate electrode 130c. The N-type active regions 124a and 124b are partially present under the dummy gate electrode 130c while being spaced from the dummy gate electrode 130b. The gate electrode 150a crosses the P-type active regions 120c and 120d while not crossing the P-type active regions 120a and 120b. The gate electrode 150b crosses the P-type active regions 120a and 120b while not crossing the P-type active regions 120c and 120d. The gate electrode 150c crosses the N-type active regions 124c and 124d while not crossing the N-type active regions 124a and 124b. The gate electrode 150d crosses the N-type active regions 124a and 124b while not crossing the N-type active regions 124c and 124d.

Figure 6:
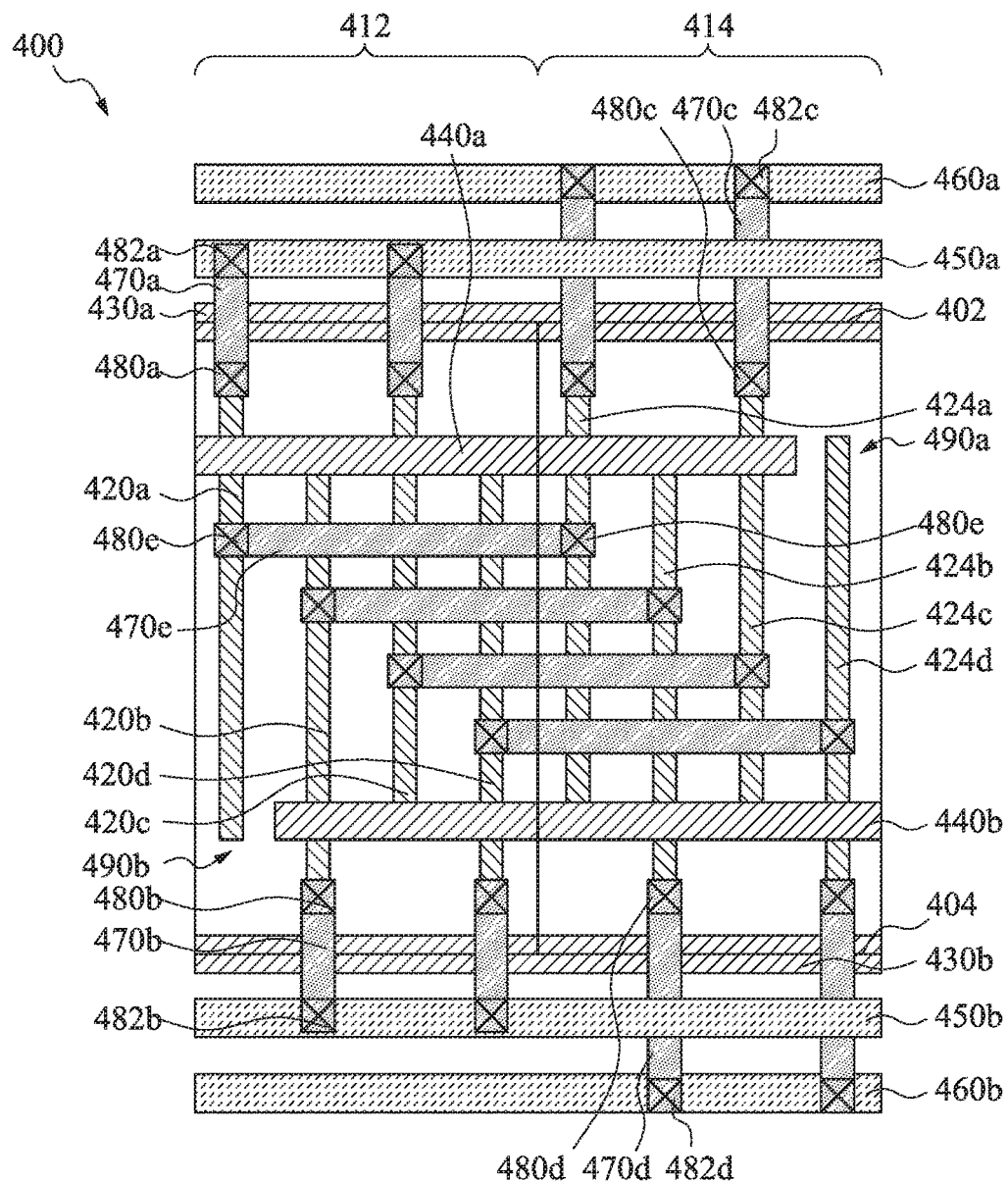
FIG. 6 is a layout in accordance with some embodiments of the disclosure.

FIG. 6 is a top view of a layout in accordance with some embodiments of the present disclosure. The cell 400 includes a PMOS region 412 and an NMOS region 414, in which the NMOS region 414 is arranged horizontally next to the PMOS region 412. A plurality of P-type active regions 420a-420d are present in the PMOS region 412. The P-type active regions 420a-420d are substantially parallel to each other and are staggered in the PMOS region 412. The P-type active regions 420a-420d are substantially perpendicular to the top edge 402 of the cell 400.

A plurality of N-type active regions 424a-424d are present in the NMOS region 414. The N-type active regions 424a-424d are substantially parallel to each other and are staggered in the NMOS region 414. The N-type active regions 424a-424d are substantially perpendicular to the top edge 402 of the cell 400 as well.

The cell 400 includes a plurality of dummy gate electrodes 430a and 430b and a plurality of gate electrodes 440a and 440b. The dummy gate electrodes 430a and 430b are respectively present on the top edge 402 and the bottom edge 404 of the cell 400. The dummy gate electrode 430a is partially present on edges of the P-type active regions 420a and 420c and the N-type active regions 424a and 424c. The dummy gate electrode 430b is partially present on edges of the P-type active regions 420b and 420d and the N-type active regions 424b and 424d. The gate electrodes 440a and 440b are arranged between the dummy gate electrodes 430a and 430b. The gate electrodes 440a and 440b are substantially parallel to each other and are substantially parallel to the top edge 402.

The cell 400 further includes a plurality of cutting patterns 490a and 490b for respectively terminating the gate electrodes 440a and 440b. The gate electrode 440a crosses the P-type active regions 420a and 420c and the N-type active regions 424a and 424c while not crossing the N-type active region 424d because of existence of the cutting pattern 490a. The gate electrode 440b crosses the N-type active regions 424b and 424d and the P-type active regions 420b and 420d while not crossing the P-type active region 420a because of existence of the cutting pattern 490b.

In some embodiments, the gate electrodes 440a is partially present on edges of the P-type active regions 420b and 420d and the N-type active region 424b, and thus the gate electrode 440a is regarded as a dummy gate electrode to each of the P-type active regions 420b and 420d and the N-type active regions 424b. The gate electrode 440b is partially present on edges of the P-type active region 420c and the N-type active regions 424a and 424c, and thus the gate electrode 440b is regarded as a dummy gate electrode to each of the P-type active region 420c and the N-type active regions 424a and 424c.

Two VDD power supply lines 450a and 450b are implemented, for example, in metal two lines. The VDD power supply lines 450a and 450b are respectively arranged at opposite sides of the cell 400. Two VSS ground lines 460a and 460b are implemented, for example, in metal two lines. The VSS ground lines 460a and 460b are arranged at opposite sides of the cell 400 as well. In FIG. 6, the VDD power supply line 450a is present between the VSS ground line 460a and the top edge 402 of the cell 400, and the VDD power supply line 450b is present between the bottom edge 404 of the cell 400 and the VDD ground line 460b.

In a top-down sequence, the VDD power supply line 450a is connected through conductive via ones 482a, conductive metal one lines 470a, and conductive via zeros 480a to each of source regions in the P-type active regions 420a and 420c. The VDD power supply line 450b is connected through conductive via ones 482b, conductive metal one lines 470b, and conductive via zeros 480b to each of source regions in the P-type active regions 420b and 420d. The VSS ground line 460a is connected through conductive via ones 482c, conductive metal one lines 470c, and conductive via zeros 480c to each of source regions in the N-type active regions 424a and 424c. The VSS ground line 460b is connected through conductive via ones 482d, conductive metal one lines 470d, and conductive via zeros 480d to each of source regions in the N-type active regions 424b and 424d.

Drain regions in the P-type active regions 420a-420d are respectively connected to the corresponding drain regions in the N-type active regions 424a-424d through conductive metal one lines 470e and conductive via zeros 480e. As a result, the source region in the P-type active region 420a is connected to the VDD power supply line 450a, the drain region in the P-type active region 420a is connected to the drain region in the N-type active region 424a, and the source region in the N-type active region 424a is connected to the VSS ground line 460a. The source region in the P-type active region 420c is connected to the VDD power supply line 450a, the drain region in the P-type active region 420c is connected to the drain region in N-type active region 424c, and the source region in the N-type active region 424c is connected to the VSS ground line 460a. The P-type active regions 420a and 420c, and the N-type active regions 424a and 424c share the gate electrode 440a, thus an inverter including the P-type active regions 420a and 420c, the N-type active regions 424a and 424c and the gate electrode 440a is provided.

Similarly, the source region in the P-type active region 420b is connected to the VDD power supply line 450b, the drain region in the P-type active region 420b is connected to the drain region in the N-type active region 424b, and the source region in the N-type active region 424b is connected to the VSS ground line 460b. The source region in the P-type active region 420d is connected to the VDD power supply line 450b, the drain region in the P-type active region 420d is connected to the drain region in the N-type active region 424d, and the source region in the N-type active region 424d is connected to the VSS ground line 460b. The P-type active regions 420b and 420d and the N-type active regions 424b and 424d share the gate electrode 440b, thus an inverter including the P-type active regions 420b and 420d, the N-type active regions 424b and 424d, and the gate electrode 440b is provided.

Figure 7:
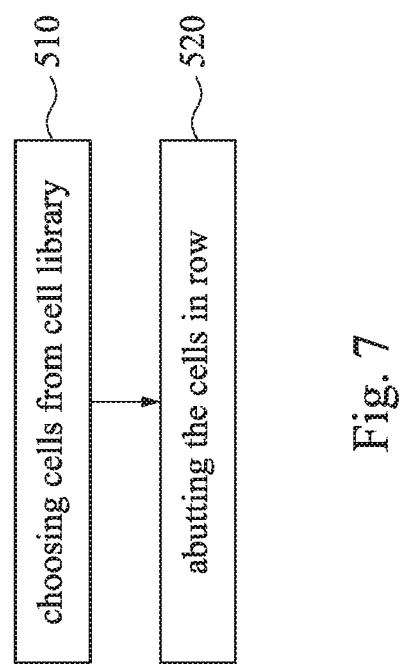
FIG. 7 is a flowchart of a method of configuring an integrated circuit layout in accordance with some embodiments of the disclosure.

Reference is made to FIG. 7, which is a flowchart of a method of configuring an integrated circuit layout in accordance with some embodiments of the disclosure. In the design of an integrated circuit, various cells having predetermined functions are used, and the layouts of cells are stored in, for example, at least one cell library. The method begins at operation 510, in which a plurality of cells are chosen from the cell library. The cells can be any of the cells described above. The method goes to operation 520, in which the cells are placed into one or more desired locations on an integrated circuit layout and are abutted in at least one row. At least one of the dummy gate electrodes of the cells are continuous across at least one common boundary between adjacent cells.

Figure 8:
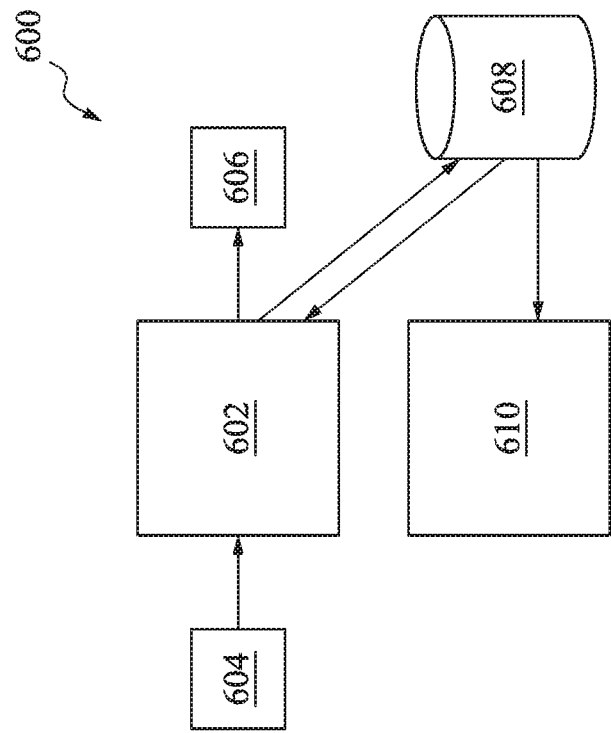
FIG. 8 is a processing system to generate one or more of the above described layout embodiments in accordance with some embodiments of the disclosure.

Reference is made to FIG. 8, which is a processing system 600 to generate one or more of the above described layout embodiments. Processing system 600 includes a processor 602, which may include a central processing unit, an input/output circuitry, a signal processing circuitry, and a volatile and/or a non-volatile memory. Processor 602 receives input, such as user input, from input device 604. The input device 604 may include one or more of a keyboard, a mouse, a tablet, a contact sensitive surface, a stylus, a microphone, and the like. The processor 602 may also receive input, such as standard cell layouts, cell libraries, models, and the like, from a non-transitory machine readable storage medium 608. The non-transitory machine readable storage medium may be located locally to the processor 602, or may be remote from the processor 602, in which communications between the processor 602 and the non-transitory machine readable storage medium 608 occur over a network, such as a telephone network, the Internet, a local area network, wide area network, or the like. The non-transitory machine readable storage medium 608 may include one or more of a hard disk, magnetic storage, optical storage, non-volatile memory storage, and the like. Included in the non-transitory machine readable storage medium 608 may be database software for organizing data and instructions stored on the non-transitory machine readable storage medium 608. The processing system 600 may include an output device 606, such as one or more of a display device, speaker, and the like for outputting information to a user. As described above, the processor 602 generates a layout for an integrated circuit. The layout may be stored in the non-transitory machine readable storage medium 608. One or more integrated circuit manufacturing machines, such as a photomask generator 610 may communicate with the non-transitory machine readable storage medium 608, either locally or over a network, either directly or via an intermediate processor such as processor 602. In some embodiments, the photomask generator 610 generates one or more photomasks to be used in the manufacture of an integrated circuit, in conformance with a layout stored in the non-transitory machine readable storage medium 608.

In some embodiments, at least one dummy gate electrode continuously extends across the cells. Since the dummy gate electrode is electrically conductive, the dummy gate electrode can be utilized for interconnecting the cells. That is, some signals may travel through the dummy gate electrode rather than through a metal one line or a metal two line. Therefore, an amount of metal one lines and/or metal two lines for interconnecting the cells can be reduced.

According to some embodiments of the disclosure, an integrated circuit includes a first cell and a second cell. The first cell includes at least one first active region and at least one first gate electrode crossing the first active region. The second cell includes at least one second active region and at least one second gate electrode crossing the second active region. The first gate electrode and the second gate electrode are arranged end-to-end. The integrated circuit further includes at least one dummy gate electrode partially present on edges of the first active region and the second active region. The dummy gate electrode is continuous at least between the first active region and the second active region.

According to some embodiments of the disclosure, an integrated circuit includes at least one first active region, at least one first gate electrode crossing the first active region, at least one second active region, at least one second gate electrode crossing the second active region, in which the second gate electrode is disconnected with the first gate electrode. The integrated circuit further includes at least one first dummy gate electrode partially present on edges of the first active region and the second active region, in which a length of the first dummy gate electrode is greater than a length of the first gate electrode.

According to some embodiments, a method of configuring an integrated circuit layout using a processor includes using the processor, choosing a plurality of cells from a cell library; using the processor, placing the cells on the integrated circuit layout, wherein the placing the cells forms at least one continuous PODE (poly on OD edge) on the integrated circuit layout, and the continuous PODE extends across at least one common boundary between the cells; generating a set of instructions for manufacturing an integrated circuit based upon the integrated circuit layout; and storing the set of instructions in an non-transitory machine readable storage medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming a first cell, wherein forming the first cell comprises:
        forming a first active region; and
        forming a first gate electrode over the first active region;
    forming a second cell, wherein forming the second cell comprises:
        forming a second active region; and
        forming a second gate electrode over the second active region, wherein the first gate electrode and the second gate electrode are aligned along a same line and are separated from each other; and
    forming a first dummy gate electrode that extends continuously along a first edge of the first cell and along a first edge of the second cell, wherein in a top view, the first dummy gate electrode overlaps with a first end of the first active region and overlaps with a first end of the second active region.

2. The method of claim 1, wherein forming the first cell further comprises forming a third active region in the first cell, the third active region being parallel to the first active region, wherein in the top view, the first active region and the third active region are staggered.

3. The method of claim 2, wherein forming the first cell further comprises forming a third gate electrode in the first cell over the third active region, the third gate electrode being parallel to the first gate electrode, wherein in the top view, the first gate electrode and the third gate electrode are staggered.

4. The method of claim 1, wherein forming the first dummy gate electrode comprises forming the first dummy gate electrode using an electrically conductive material.

5. The method of claim 1, wherein the first cell and the second cell have a same cell height, wherein the first cell and the second cell are formed immediately adjacent to each other and aligned in a row.

6. The method of claim 5, wherein the first active region of the first cell is formed in a PMOS region of the first cell, and the second active region of the second cell is formed in a PMOS region of the second cell, wherein the first active region and the second active region are aligned in a longitudinal direction of the row.

7. The method of claim 6, wherein forming the first cell further comprises forming a third active region in an NMOS region of the first cell, wherein the first active region and the third active region are aligned along a same line.

8. The method of claim 7, wherein the method further comprises forming a second dummy gate electrode between the PMOS region of the first cell and the NMOS region of the first cell.

9. The method of claim 8, wherein the method further comprises forming a third dummy gate electrode along a second edge of the first cell opposing the first edge of the first cell, wherein the second dummy gate electrode is between the first dummy gate electrode and the third dummy gate electrode.

10. The method of claim 5, wherein the first dummy gate electrode extends along a longitudinal direction of the row.

11. The method of claim 10, wherein a length of the first dummy gate electrode, measured along the longitudinal direction of the row, is larger than a sum of a first length of the first gate electrode and a second length of the second gate electrode, wherein the first length and the second length are measured along the longitudinal direction of the row.

12. The method of claim 1, further comprising forming a second dummy gate electrode along a second edge of the first cell opposing the first edge of the first cell, and along a second edge of the second cell opposing the first edge of the second cell.

13. A method of forming an integrated circuit, the method comprising:
forming a first p-type active region;
forming a first gate electrode across the first p-type active region;
forming a first n-type active region, the first n-type active region being parallel to the first p-type active region;
forming a second gate electrode across the first n-type active region, the second gate electrode being parallel with the first gate electrode, the second gate electrode being spaced apart from the first gate electrode; and
forming a first dummy gate electrode between the first p-type active region and the first n-type active region, the first dummy gate electrode extending in parallel with the first gate electrode.

14. The method of claim 13, wherein in a top view, the first dummy gate electrode overlaps at least partially with a first end of the first p-type active region and overlaps at least partially with a first end of the first n-type active region.

15. The method of claim 13, wherein a length of the first dummy gate electrode is greater than a length of the first gate electrode and greater than a length of the second gate electrode.

16. The method of claim 13, further comprising:
forming a second p-type active region on a same side of the first dummy gate electrode as the first p-type active region, the second p-type active region being parallel with the first p-type active region; and
forming a third gate electrode across the second p-type active region, the third gate electrode being parallel to the first gate electrode.

17. The method of claim 16, wherein a length of the first dummy gate electrode is greater than a sum of a length of the first gate electrode and a length of the third gate electrode.

18. A method of forming an integrated circuit, the method comprising:
forming a first cell, where forming the first cell comprises:
forming a first fin in a PMOS region of the first cell;
forming a second fin in the PMOS region of the first cell, the second fin extending in parallel with the first fin along a first direction;
forming a first gate electrode over the first fin, the first gate electrode overlapping with an end of the second fin in a top view;
forming a third fin in an NMOS region of the first cell;
forming a fourth fin in the NMOS region of the first cell, the third fin and the fourth fin extending in parallel with the first fin;
forming a second gate electrode over the third fin, the second gate electrode overlapping with an end of the fourth fin in the top view; and
forming a first dummy gate electrode between the PMOS region and the NMOS region, the first dummy gate electrode extending in a second direction perpendicular to the first direction, wherein the first gate electrode and the second gate electrode are parallel with each other, and are disposed on opposing sides of the first dummy gate electrode.

19. The method of claim 18, wherein forming the first dummy gate electrode comprises forming the first dummy gate electrode using an electrically conductive material.

20. The method of claim 18, where forming the first cell further comprises forming a fifth fin in the PMOS region of the first cell, the fifth fin extending in the first direction, the first gate electrode extending over the first fin and over the fifth fin.

* * * * *